(12) United States Patent
Ogino

(10) Patent No.: US 10,600,440 B2
(45) Date of Patent: Mar. 24, 2020

(54) SPUTTERING TARGET FOR FORMING MAGNETIC RECORDING FILM AND METHOD FOR PRODUCING SAME

(71) Applicant: JX Nippon Mining & Metals Corporation, Tokyo (JP)

(72) Inventor: Shin-ichi Ogino, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 297 days.

(21) Appl. No.: 15/513,017

(22) PCT Filed: Jul. 7, 2015

(86) PCT No.: PCT/JP2015/069476
§ 371 (c)(1),
(2) Date: Mar. 21, 2017

(87) PCT Pub. No.: WO2016/047236
PCT Pub. Date: Mar. 31, 2016

(65) Prior Publication Data
US 2017/0294203 A1    Oct. 12, 2017

(30) Foreign Application Priority Data

Sep. 22, 2014 (JP) .................................. 2014-192926

(51) Int. Cl.
*C22C 5/04* (2006.01)
*C22C 1/10* (2006.01)
(Continued)

(52) U.S. Cl.
CPC .............. *G11B 5/851* (2013.01); *B22F 3/15* (2013.01); *C22C 1/0466* (2013.01); *C22C 1/1084* (2013.01); *C22C 5/04* (2013.01); *C22C 29/00* (2013.01); *C22F 1/00* (2013.01); *C23C 14/165* (2013.01); *C23C 14/3407* (2013.01); *C23C 14/3414* (2013.01); *H01F 1/068* (2013.01); *H01F 41/183* (2013.01); *H01J 37/3405* (2013.01); *H01J 37/3429* (2013.01); *B22F 2998/10* (2013.01)

(58) Field of Classification Search
CPC .......................... C23C 14/3407; H01J 37/3429
See application file for complete search history.

(56) References Cited

U.S. PATENT DOCUMENTS 8,858,674 B2    10/2014    Miyashita et al.
9,034,153 B2    5/2015    Satoh
(Continued)

FOREIGN PATENT DOCUMENTS

JP        63104886 A  *  5/1988    .............. B41M 5/26
JP        2012-102387 A    5/2012
(Continued)

*Primary Examiner* — John J Brayton
(74) *Attorney, Agent, or Firm* — Howson & Howson LLP

(57) ABSTRACT

An FePt-based sintered sputtering target containing C and/or BN, wherein an area ratio of AgCu alloy grains on a polished surface of a cross section that is perpendicular to a sputtered surface of the sputtering target is 0.5% or more and 15% or less. An object of this invention is to provide a sputtering target capable of reducing particles generation during sputtering and efficiently depositing a magnetic thin film of a magnetic recording medium.

13 Claims, 2 Drawing Sheets

Dark gray area is AgCu alloy phase

Binarized image

(51) Int. Cl.

| | | |
|---|---|---|
| *C23C 14/34* | (2006.01) | |
| *C22C 1/04* | (2006.01) | |
| *C22C 29/00* | (2006.01) | |
| *B22F 3/15* | (2006.01) | |
| *C23C 14/16* | (2006.01) | |
| *H01F 1/06* | (2006.01) | |
| *H01F 41/18* | (2006.01) | |
| *H01J 37/34* | (2006.01) | |
| *G11B 5/851* | (2006.01) | |
| *C22F 1/00* | (2006.01) | |

(56) References Cited

U.S. PATENT DOCUMENTS

| | | | |
|---|---|---|---|
| 9,269,389 B2 | 2/2016 | Arakawa | |
| 2013/0098760 A1* | 4/2013 | Takami | C23C 14/0688 204/298.13 |
| 2013/0168240 A1 | 7/2013 | Ogino et al. | |
| 2013/0213803 A1 | 8/2013 | Sato et al. | |
| 2013/0306470 A1 | 11/2013 | Ogino et al. | |
| 2013/0306471 A1* | 11/2013 | Ishiyama | B22F 3/14 204/298.13 |
| 2014/0083847 A1 | 3/2014 | Sato | |
| 2014/0231250 A1 | 8/2014 | Ogino et al. | |
| 2014/0346039 A1 | 11/2014 | Ogino | |
| 2014/0360871 A1 | 12/2014 | Sato et al. | |
| 2015/0060268 A1 | 3/2015 | Ogino | |
| 2015/0107411 A1 | 4/2015 | Ogino | |
| 2015/0107991 A1 | 4/2015 | Sato | |
| 2015/0213822 A1 | 7/2015 | Ogino | |

FOREIGN PATENT DOCUMENTS

| | | |
|---|---|---|
| JP | 2012-178210 A | 9/2012 |
| JP | 2013-055127 A | 3/2013 |
| WO | 2014/065201 A1 | 5/2014 |
| WO | 2014/171161 A1 | 10/2014 |

* cited by examiner

[FIG. 1]
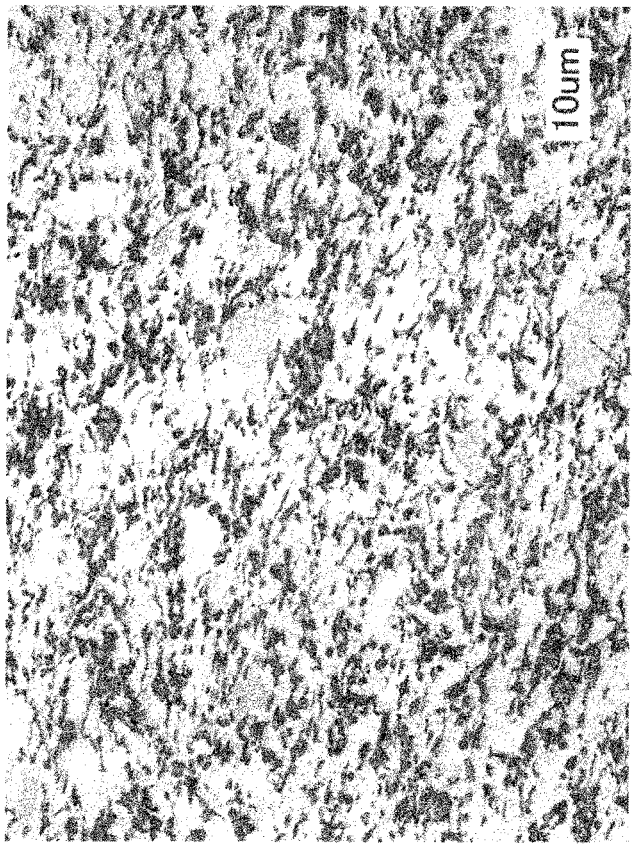

[FIG. 2]
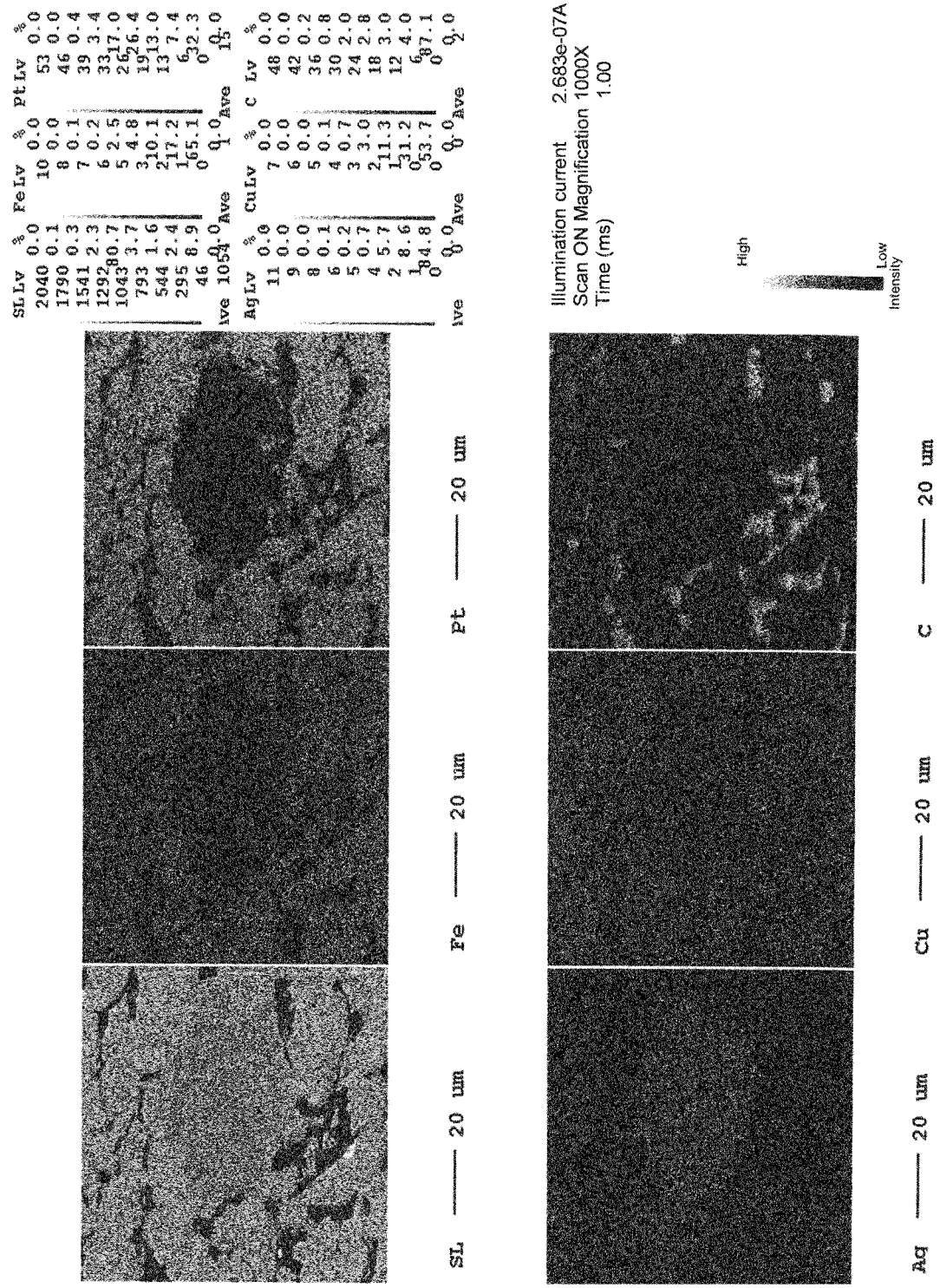

SPUTTERING TARGET FOR FORMING MAGNETIC RECORDING FILM AND METHOD FOR PRODUCING SAME

BACKGROUND

The present invention relates to a ferromagnetic sputtering target that is used for the deposition of a magnetic thin film of a magnetic recording media, particularly for the deposition of a magnetic recording layer of a thermally assisted magnetic recording media, and to an FePt-based sintered sputtering target capable of achieving a stable discharge and reducing particle generation when sputtered with magnetron sputtering equipment.

In the field of magnetic recording mediums as represented with HDDs (hard disk drives), a material based on Co, Fe or Ni as ferromagnetic metals is being used as the material of a magnetic thin film which is used for the recording. For example, Co—Cr-based or Co—Cr—Pt-based ferromagnetic alloys containing Co as its main component are used for the recording layer of hard disks adopting the longitudinal magnetic recording system. Moreover, composite materials of Co—Cr—Pt-based ferromagnetic alloys containing Co as its main component and nonmagnetic inorganic grains are often used for the recording layer of hard disks adopting the perpendicular magnetic recording system which was recently put into practical application. In addition, a magnetic thin film of a magnetic recording medium such as a hard disk is often produced by sputtering a ferromagnetic sputtering target having the foregoing materials as its components in light of its high productivity.

Meanwhile, the recording density of magnetic recording mediums is rapidly increasing year by year, and the current surface density of 100 $Gbit/in^2$ is expected to reach 1 $Tbit/in^2$ in the future. When the recording density reaches 1 $Tbit/in^2$, the size of the recording bit will fall below 10 nm. In such a case, it is anticipated that the superparamagnetization caused by thermal fluctuation will become a problem, and it is further anticipated that the currently used magnetic recording medium; for instance, a material with higher magnetic crystalline anisotropy obtained by adding Pt to a Co—Cr-based alloy, or a medium in which B is further added to the foregoing material to attenuate the magnetic coupling between the magnetic grains; will no longer be sufficient. This is because, for grains to stably behave ferromagnetically at a size of 10 nm or less, the grains need to possess even higher magnetic crystalline anisotropy.

In light of the above, an FePt phase having an $L1_0$ structure is attracting attention as a material for use in an ultrahigh density recording medium. Moreover, since an FePt phase having a $L1_0$ structure yields superior corrosion resistance and oxidation resistance, it is expected to become a material that can be suitably applied as a recording medium. The FePt phase has an order-disorder transformation point at 1573 K, and has a $L1_0$ structure even when an alloy is quenched from a high temperature due to the rapid ordered reaction. Furthermore, in connection with using the FePt phase as a material for use in an ultrahigh density recording medium, demanded is the development of technology for dispersing the ordered FePt phase, in a magnetically separated state, while densely aligning the orientation thereof as much as possible. In light of the foregoing circumstances, a magnetic thin film having a granular structure in which the FePt magnetic phase having an $L1_0$ structure is magnetically separated from each other through the interposition of nonmagnetic substances is being proposed for use in a magnetic recording medium of next-generation hard disks adopting the thermally assisted magnetic recording system.

This magnetic thin film having a granular structure has a structure in which the magnetic grains are magnetically insulated from each other through the interposition of nonmagnetic substances. The foregoing magnetic recording layer is configured from a magnetic phase such as a FePt alloy, and a nonmagnetic phase which is separating the magnetic phase, and it is known that C and BN are effective as a material of the nonmagnetic phase. When forming this kind of magnetic thin film, it is common to use an FePt alloy sputtering target containing C, rather than using multiple targets; that is, a C target and an FePt alloy target (for example, Patent Documents 1 and 2). Previously, the present inventors invented an FePt-based sputtering target containing C for forming a magnetic recording film (Patent Document 3), and an FePt-based sputtering target containing BN for forming a magnetic recording film (Patent Document 4).

An FePt-based sputtering target containing C or BN is normally prepared based on the powder sintering method. However, since the coefficient of thermal expansion of C or BN is too small relative to an FePt alloy, the compressive stress applied to C or BN increases as the sintering temperature becomes higher and, therefore, there were cases where C or BN would be subject to physical defects and cause particle generation during sputtering. Meanwhile, if the sintering temperature is too low, the density of the target will deteriorate, and there is a problem in that this would cause particle generation.

CITATION LIST

Patent Documents

Patent Document 1: JP 2012-102387 A
Patent Document 2: JP 2012-214874 A
Patent Document 3: WO 2014/013920
Patent Document 4: WO 2014/065201
Patent Document 5: JP 5041261 B
Patent Document 6: JP 5041262 B

SUMMARY

An object of the present invention is to provide an FePt-based sintered sputtering target which is used for forming a magnetic recording layer and configured from a magnetic phase such as an FePt-based alloy, and a nonmagnetic phase that is separating the magnetic phase, wherein C and/or BN are used as a nonmagnetic phase material. More specifically, an object of the present invention is to provide a high density FePt-based sputtering target capable of suppressing the particle generation during sputtering.

In order to achieve the foregoing object, as a result of intense study, the present inventors discovered that it is possible to increase the density of the target, even at a sintering temperature that is lower than conventional technologies, by adding a AgCu alloy having a low melting point as the sintering additive to the raw material, and consequently possible to reduce particle generation during sputtering that are caused by defects based on C or BN or deterioration in density.

Based on the foregoing discovery, the present invention provides:
1) An FePt-based sintered sputtering target containing C and/or BN, wherein an area ratio of AgCu alloy grains on a polished surface of a cross section that is perpendicular to a sputtered surface of the sputtering target is 0.5% or more and 15% or less.

2) The sputtering target according to 1) above, wherein a total content of Ag and Cu relative to an overall composition of the sputtering target is 1 to 20 mol %.

3) The sputtering target according to 2) above, wherein a content ratio of Cu relative to Ag in the sputtering target is 10 to 85 mol %.

4) The sputtering target according to 1) or 2) above, wherein a Pt content relative to an overall composition of the sputtering target is 30 to 70 mol %.

5) The sputtering target according to any one of 1) to 3) above, wherein a C content relative to an overall composition of the sputtering target is 5 to 60 mol %.

6) The sputtering target according to any one of 1) to 4) above, wherein a BN content relative to an overall composition of the sputtering target is 2 to 40 mol %.

7) The sputtering target according to any one of 1) to 5) above, wherein one or more types of metal oxides selected from Y, Ti, Zr, Hf, V, Nb, Ta, Cr, Mo, W, Mn, Fe, Co, Ni, Al, Ga, and Si are each contained in an amount of 0.1 to 20 mol % relative to an overall composition of the sputtering target.

8) The sputtering target according to any one of 1) to 6) above, wherein the sputtering target has a relative density of 95% or higher.

The FePt-based sintered sputtering target containing C and/or BN of the present invention yields a superior effect of being able to considerably reduce the number of particles generated during sputtering. Accordingly, the present invention yields an effect of being able to efficiently deposit a magnetic thin film of a magnetic recording medium, particularly a granular-type magnetic recording layer.

BRIEF DESCRIPTION OF DRAWINGS

FIG. 1 This is a laser microgram and a binarized image of the sintered compact of Example 1.

FIG. 2 This is an elemental mapping of the sintered compact of Example 1 obtained based on FE-EPMA.

DETAILED DESCRIPTION

Generally speaking, as the melting point of a metal material is lower, the metal material will soften at a lower temperature. Thus, by adding a material with a low melting point as the sintering additive, the density of the sintered compact can be increased even at a low sintering temperature. As metals that may be used as the sintering additive to be added to an FePt-based sintered sputtering target, known is the independent addition of Au, Ag or Cu.

The present inventors took particular note of the fact that, with a AgCu alloy which is made from Ag (melting point: 961.8° C.) and Cu (melting point: 1064.6° C.), the melting point thereof can be lowered to 779.1° C. based on a eutectic reaction, and discovered that it is possible to obtain a high density compact even at a lower sintering temperature by using a AgCu alloy as the sintering additive. Note that, in the present invention, the term "AgCu alloy" refers to an alloy of a compositional range (Cu: 14.1 to 95.1 at %) in which the liquid phase of the alloy appears at 779.1° C. in a binary phase diagram of Ag—Cu.

The addition of Ag, Cu or the like to an FePt-based alloy sputtering target has been conventionally known (for instance, Patent Documents 3 to 6). Nevertheless, the addition is aimed at improving the magnetic properties, and these elements are not added as a sintering additive. Moreover, the method of adding these elements in these conventional technologies is the independent addition of Ag or Cu, or the addition of a AgPt alloy or a CuPt alloy, and it is not a method of adding a AgCu alloy with a relatively low melting point.

In particular, Patent Documents 5 and 6 describe that a high density target can be obtained by mixing a AgPt alloy powder, which has a higher melting point than a pure Ag, and thereby increasing the sintering temperature, and this technique is clearly different from the present invention which lowers the melting point by alloying Ag and Cu.

Based on the foregoing discovery, the FePt-based sintered sputtering target containing C and/or BN of the present invention has a texture in which C and/or BN nonmagnetic grains are dispersed in a ferromagnetic material made from an FePt-based alloy. Specifically, the present invention is characterized in that an area ratio of AgCu alloy grains on a polished surface of a cross section that is perpendicular to a sputtered surface of the sputtering target is 0.5% or more and 15% or less. Here, the reason why the texture of the perpendicular cross section is prescribed is because C and BN used as the raw materials are in the form of flakes, and therefore, when they are hot pressed based on uniaxial pressing, the appearance of the texture will differ on the perpendicular cross section and on the horizontal cross section. Here, since the perpendicular cross section will appear to be layered like a unique stratum, the texture of the perpendicular cross section has been prescribed.

The AgCu alloy grains are observed under a laser microscope at 10 arbitrary locations of the sputtering target in a visual field of 60 μm×80 μm after mirror-polishing the surface of a cross section that is perpendicular to the sputtered surface of the sputtering target until the AgCu alloy grains can become identified, and then the average area ratio thereof is obtained. Note that an emery paper of SiC abrasive grains is used for the polishing. Polishing is performed by using the emery papers in the following order with the grain size being #240, #400, #600, and #1000 (JISR6010). Subsequently, as the finishing process, wet polishing is performed using alumina abrasive grains having a grain size of 0.3 μm. The method of calculating the area ratio is as follows.

Foremost, a laser microscope (VK-9710 manufactured by Keyence; magnification: objective lens 20××digital zoom 1×) is used to take a laser micrograph (visual field: vertical 60 μm×horizontal 80 μm) of the perpendicular cross section of the target. Next, an FE-EPMA is used to perform elemental analysis at the same locations as the laser micrograph to identify the AgCu alloy. Here, the grains in which Ag and Cu are detected at the same location in the FE-EPMA image are determined to be the AgCu alloy grains. Since the AgCu alloy grains (alloy phase) appear darker than the FePt-based alloy phase and the Ag single phase but lighter than the C phase and the BN phase, it is possible to binarize and digitally differentiate only the AgCu alloy phase by utilizing the contrast difference. Note that, when oxides are added, the oxide phase will also appear darker than the AgCu alloy grains as with the C phase and the BN phase, and therefore the oxide phase can also be easily differentiated by using the contrast difference. The area ratio of the AgCu alloy grains is calculated based on the thus obtained binarized data. Note that, upon performing binarization, since those in which the area is 100 pixels or less are likely of being noise, those values are not included in the binarized data.

With the sputtering target of the present invention, preferably, the total content of Ag and Cu relative to the overall composition of the sputtering target is 1 to 20 mol %. When the total content of Ag and Cu is less than 1 mol %, the effect of adding the AgCu alloy as a sintering additive cannot be exhibited sufficiently, the density of the sintered compact (sputtering target) cannot be improved thereby, and particle generation tends to increase; therefore this is undesirable. Meanwhile, when the total content of Ag and Cu exceeds 20 mol %, characteristic control of the magnetic thin film formed via sputtering becomes difficult; therefore this is also undesirable. Moreover, with the sputtering target of the present invention, preferably, the content ratio of Cu relative to the total content of Ag and Cu is 10 to 85 mol %. When the content ratio of Cu relative to the total content of Ag and Cu is less than 10 mol % or exceeds 85 mol %, the effect of reducing the melting point of the AgCu alloy cannot be exhibited sufficiently, the density of the sintered compact (sputtering target) cannot be improved thereby, and particle generation tends to increase; therefore this is undesirable.

Moreover, with the sputtering target of the present invention, preferably, the content ratio of Cu relative to Ag in the sputtering target is 10 to 85 mol %. When the content ratio of Cu relative to Ag is less than 10 mol % or exceeds 85 mol %, the effect of reducing the melting point of the AgCu alloy cannot be exhibited sufficiently, the density of the sintered compact (sputtering target) cannot be improved thereby, and particle generation tends to increase; therefore this is undesirable.

With the sputtering target of the present invention, preferably, the Pt content relative to the overall composition of the sputtering target is 30 mol % or more and 70 mol % or less. Favorable magnetic properties can be obtained by causing the Pt content to be 30 mol % or more and 70 mol % or less. Moreover, the C content is set to be 5 mol % or more and 60 mol % or less, and preferably 5 mol % or more and 50 mol % or less, relative to the overall composition of the sputtering target. Furthermore, the BN content is set to be 2 mol % or more and 40 mol % or less, and preferably 2 mol % or more and 34 mol % or less, relative to the overall composition of the sputtering target. The total content of C and BN is preferably 3 vol % or more and 50 vol % or less. By causing the contents of the foregoing elements to be within the foregoing numerical ranges, it is possible to improve magnetic insulation.

Moreover, with the sputtering target of the present invention, preferably, one or more types of metal oxides selected from Y, Ti, Zr, Hf, V, Nb, Ta, Cr, Mo, W, Mn, Fe, Co, Ni, Al, Ga, and Si are each contained in an amount of 0.1 to 20 mol % relative to the overall composition of the sputtering target. These oxides are effective components for improving the magnetic properties of the sputtered film. Note that, in the FePt-based sintered sputtering target of the present invention, other than Pt, C and/or BN, AgCu, and the foregoing metal oxides, the remainder is Fe. The content of each of these components can be measured based on ICP (high-frequency inductively coupled plasma) emission spectrometry.

With the sputtering target of the present invention, preferably, the density is 95% or higher. It is thereby possible to prepare a uniform thin film with minimal generation of abnormal discharge (arcing) during the deposition process. Note that the relative density in the present invention is a value obtained by dividing the measured density of the target by the calculated density (also referred to as the theoretical density). The calculated density is the density when it is assumed that the constituents of the target coexist without mutually dispersing or reacting to one another, and is calculated according to the following formula.

calculated density=Σ(molecular weight of constituents×atomic weight ratio of constituents)/Σ(molecular weight of constituents×atomic weight ratio of constituents/literature data density of constituents)　　　Formula:

Here, Σ implies taking on the sum of all constituents of the target.

The FePt-based sintered sputtering target of the present invention can be prepared according to the following method.

Foremost, the respective raw material powders (Fe powder, Pt powder, C powder, BN powder, AgCu alloy powder) are prepared. Moreover, as the raw material powder, an alloy powder (Fe—Pt powder) that is previously alloyed via heat treatment or with an atomization device may also be used. An alloy powder containing Pt, while this will also depend on the composition thereof, is effective for reducing the oxygen content in the raw material powder. Moreover, a Ag powder and a Cu powder may each be used in substitute for the AgCu alloy powder and caused to become alloyed during sintering. Furthermore, the respective raw material powders of the metal oxides listed above are prepared as needed.

Next, the metal powders (Fe powder, Pt powder, Fe—Pt alloy powder) are pulverized using a ball mill, a medium agitation mill or the like. Normally, the raw material powders of these metals have a spherical shape, a bulk shape or other indefinite shapes, but these can be pulverized using a ball mill or a medium agitation mill to obtain a flaked shape. As a result of using this kind of flaked powders, a layered structure is formed in a perpendicular cross-section direction of the sintered compact, it is possible to stabilize the crystal orientation of the Fe—Pt alloy phase, and this will also contribute to the stabilization of the discharge. Preferably, each of these raw material powders has an average grain size of 10 to 100 μm.

Subsequently, these raw material powders are weighed to attain the intended composition and pulverized, and the thus obtained metal powders are mixed with the AgCu alloy powder, the C powder and/or the BN powder by using a mortar, a medium agitation mill, a sieve or the like. The oxides as additive components may be added together with the metal raw material powders, or added together with the C powder or the BN powder, or otherwise added at the stage of mixing the metal raw material powders and the C powder and/or the BN powder.

Subsequently, the obtained mixed powder is molded and sintered via hot press. Other than hot press, adopted may be the plasma discharge sintering method, or the hot isostatic sintering method. The holding temperature during sintering is, in many cases, within a temperature range of 750 to 800° C., even though this will also depend on the composition of the sputtering target. Sintering was conventionally performed within a temperature range of 800° C. to 1400° C. in order to increase the density, but according to the present invention, it is possible to achieve a high density, which is equivalent to conventional technologies, at a relatively low sintering temperature.

Next, the sintered compact removed from the hot press mold is subject to hot isostatic pressing (HIP). Hot isostatic pressing is effective for improving the density of the sintered compact. The holding temperature during hot isostatic pressing is, in many cases, within a temperature range of 750° C. to 800° C., even though this will also depend on the composition of the sintered compact. Conventionally, as with the hot press, hot isostatic pressing was also performed within a temperature range of 800° C. to 1200° C. in order to increase the density. However, according to the present invention, it is possible to achieve a high density, which is equivalent to conventional technologies, at a relatively low sintering temperature.

The sputtering target of the present invention can be prepared by processing the thus obtained sintered compact into an intended shape using a lathe or the like. Based on the process described above, it is possible to prepare an FePt-based sintered sputtering target containing C and/or BN and having a high density (specifically, a density of 95% or higher).

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

As the raw material powders, an FePt alloy powder, a C powder, and a AgCu alloy powder were prepared, and these powders were weighed to achieve 60(45Fe-45Pt-5Ag-5Cu)-40C (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the AgCu alloy powder and the C powder using a V-shaped mixer, and further mixed using a sieve having a sieve mesh of 150 μm, and the mixed powder was filled in a carbon mold and then hot pressed.

The hot press conditions were as follows; namely, vacuum atmosphere, rate of temperature increase of 300° C./hour, holding temperature of 750° C., and holding time of 2 hours, and a pressure of 30 MPa was applied from the start of temperature increase to the end of holding. After the end of holding, the resultant product was naturally cooled as is in the chamber.

Subsequently, the sintered compact removed from the host press mold was subject to hot isostatic pressing. The hot isostatic pressing conditions were as follows; namely, rate of temperature increase of 300° C./hour, holding temperature of 750° C., and holding time of 2 hours, and the Ar gas pressure was gradually increased from the start of temperature increase, and a pressure of 150 MPa was applied during the holding at 750° C. After the end of holding, the resultant product was naturally cooled as is in the furnace.

One end (corresponds to the cross section that is perpendicular to the sputtered surface) of the thus obtained sintered compact was cut out and mirror polished, and the polished surface was observed using a laser microscope. The resulting micrograph is shown in the left diagram of FIG. 1. In this diagram, the dark gray area corresponds to the AgCu alloy grains. Subsequently, this diagram was binarized (right diagram of FIG. 1) to obtain the area ratio (average) of the AgCu alloy grains. Consequently, the area ratio was 4.7%. It was confirmed in an FE-EPMA image that these grains are made from a AgCu alloy (refer to FIG. 2). Moreover, as a result of measuring the density of another end of this sintered compact based on the Archimedes method, the density was 95.7%.

Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were as follows; namely, after performing 2 kWhr pre-sputtering at an applied power of 1 kW and Ar gas pressure of 1.7 Pa, film deposition onto a silicon substrate having a diameter of 4 inches was performed for 20 seconds. Subsequently, the number of particles having a grain size of 0.25 μm or more that became adhered on the substrate was measured using a particle counter. The result in this case was 45 particles.

TABLE 1

| | Composition | H/P Temperature | HIP Temperature | Archimedes density after HIP | Number of particles in steady state | Area ratio of AgCu alloy phase |
|---|---|---|---|---|---|---|
| Example 1 | 60(45Fe—45Pt—5Ag—5Cu)—40C (mol %) | 750° C. | 750° C. | 95.7% | 45 | 4.7 |
| Comparative Example 1 | 60(45Fe—45Pt—10Ag)—40C (mol %) | 750° C. | 750° C. | 90.6% | 526 | — |
| Comparative Example 2 | 60(45Fe—45Pt—10Cu)—40C (mol %) | 750° C. | 750° C. | 89.3% | 677 | — |
| Comparative Example 3 | 60(50Fe—50Pt)—40C (mol %) | 750° C. | 750° C. | 87.9% | 2014 | — |
| Example 2 | 66(54Fe—40Pt—3Ag—3Cu)—34BN (mol %) | 750° C. | 750° C. | 95.2% | 89 | 1.3 |
| Comparative Example 4 | 66(54Fe—40Pt—6Ag)—34BN (mol %) | 750° C. | 750° C. | 90.1% | 833 | — |
| Example 3 | 50(60Fe—30Pt—1.5Ag—8.5Cu)—50C (mol %) | 750° C. | 750° C. | 95.0% | 68 | 5.0 |
| Comparative Example 5 | 50(60Fe—30Pt—10Ag)—50C (mol %) | 750° C. | 750° C. | 89.7% | 714 | — |
| Example 4 | 80(20Fe—70Pt—9Ag—1Cu)—20BN (mol %) | 750° C. | 750° C. | 95.6% | 66 | 3.0 |
| Comparative Example 6 | 80(20Fe—70Pt—10Cu)—20BN (mol %) | 750° C. | 750° C. | 90.2% | 480 | — |
| Example 5 | 77(35Fe—45Pt—10Ag—10Cu)—8SiO$_2$—15C (mol %) | 750° C. | 750° C. | 96.1% | 32 | 14.1 |
| Comparative Example 7 | 77(35Fe—45Pt—20Ag)—8SiO$_2$—15C (mol %) | 750° C. | 750° C. | 90.3% | 457 | — |
| Example 6 | 73(53Fe—45Pt—1Ag—1Cu)—1TiO$_2$—1Cr$_2$O$_3$—25C (mol %) | 750° C. | 750° C. | 95.3% | 40 | 0.8 |
| Comparative Example 8 | 73(53Fe—45Pt—2Ag)—1TiO$_2$—1Cr$_2$O$_3$—25C (mol %) | 750° C. | 750° C. | 89.4% | 509 | — |
| Example 7 | 78.5(45Fe—45Pt—4A9—6Cu)—0.5MnO—1Ta$_2$O$_5$—20BN | 750° C. | 750° C. | 95.0% | 86 | 2.4 |

TABLE 1-continued

|  | Composition | H/P Temperature | HIP Temperature | Archimedes density after HIP | Number of particles in steady state | Area ratio of AgCu alloy phase |
|---|---|---|---|---|---|---|
| Comparative Example 9 | (mol %) 78.5(45Fe—45Pt—10Cu)—0.5MnO—1Ta$_2$O$_5$—20BN (mol %) | 750° C. | 750° C. | 88.4% | 623 | — |
| Example 8 | 80(45Fe—45Pt—5Ag—5Cu)—15SiO$_2$—5C (mol %) | 750° C. | 750° C. | 96.1% | 32 | 3.6 |
| Comparative Example 10 | 80(45Fe—45Pt—10Ag)—15SiO$_2$—5C (mol %) | 750° C. | 750° C. | 90.3% | 457 | — |
| Example 9 | 85(45Fe—45Pt—4Ag—6Cu)—10SiO$_2$—5BN (mol %) | 750° C. | 750° C. | 95.9% | 56 | 2.4 |
| Comparative Example 11 | 85(45Fe—45Pt—10Cu)—10SiO$_2$—5BN (mol %) | 750° C. | 750° C. | 87.6% | 1096 | — |
| Example 10 | 60(50Fe—40Pt—5Ag—5Cu)—30C—10BN (mol %) | 750° C. | 750° C. | 95.2% | 91 | 2.9 |
| Comparative Example 12 | 60(50Fe—40Pt—10Ag)—30C—10BN (mol %) | 750° C. | 750° C. | 88.4% | 838 | — |

Comparative Example 1

As the raw material powders, an FePt alloy powder, a C powder, and a Ag powder were prepared, and these powders were weighed to achieve 60(45Fe-45Pt-10Ag)-40C (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 90.6%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 526 particles, and increased in comparison to the number of particles in the Examples.

Comparative Example 2

As the raw material powders, an FePt alloy powder, a C powder, and a Au powder were prepared, and these powders were weighed to achieve 60(45Fe-45Pt-10Cu)-40C (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill mixed with the Cu powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 89.3%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 677 particles, and increased significantly in comparison to the number of particles in Example 1.

Comparative Example 3

As the raw material powders, an FePt alloy powder, and a C powder were prepared, and these powders were weighed to achieve 60(50Fe-50Pt)-40C (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 87.9%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 2014 particles, and increased significantly in comparison to the number of particles in Example 1.

Example 2

As the raw material powders, an Fe powder, a Pt powder, a BN powder, and a AgCu alloy powder were prepared, and these powders were weighed to achieve 66(54Fe-40Pt-3Ag-3Cu)-34BN (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the AgCu alloy powder and the BN powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 1.3%. Moreover, as a result of measuring the density of another end of the thus obtained sintered compact based on the Archimedes method, the density was 95.2%. Next, this sintered compact was sputtered under the same conditions as Example 1. When measuring the number of particles having a grain size of 0.25 μm or more that became adhered to the substrate by a particle counter, the result was 89 particles.

Comparative Example 4

As the raw material powders, an Fe powder, a Pt powder, a BN powder, and a Ag powder were prepared, and these powders were weighed to achieve 66(54Fe-40Pt-6Ag)-34BN (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder and the BN powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 90.1%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 833 particles, and increased significantly in comparison to the number of particles in Example 2.

Example 3

As the raw material powders, an Fe powder, a Pt powder, a C powder, a Ag powder, and a Cu powder were prepared, and these powders were weighed to achieve 50(60Fe-30Pt-1.5Ag-8.5Cu)-50C (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder, the Cu powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 5.0%. Moreover, as a result of measuring the density of another end of the thus obtained sintered compact based on the Archimedes method, the density was 95.0%. Next, this sintered compact was sputtered under the same conditions as Example 1. When measuring the number of particles having a grain size of 0.25 μm or more that became adhered to the substrate by a particle counter, the result was 68 particles.

Comparative Example 5

As the raw material powders, an Fe powder, a Pt powder, a C powder, and a Ag powder were prepared, and these powders were weighed to achieve 50(60Fe-30Pt-10Ag)-50C (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 89.7%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 714 particles, and increased significantly in comparison to the number of particles in Example 3.

Example 4

As the raw material powders, an Fe powder, a Pt powder, a BN powder, a Ag powder, and a Cu powder were prepared, and these powders were weighed to achieve 80(20Fe-70Pt-9Ag-1Cu)-20BN (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder, the Cu powder and the BN powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 3.0%. Moreover, as a result of measuring the density of another end of the thus obtained sintered compact based on the Archimedes method, the density was 95.6%. Next, this sintered compact was sputtered under the same conditions as Example 1. When measuring the number of particles having a grain size of 0.25 μm or more that became adhered to the substrate by a particle counter, the result was 66 particles.

Comparative Example 6

As the raw material powders, an Fe powder, a Pt powder, a BN powder, and a Cu powder were prepared, and these powders were weighed to achieve 80(20Fe-70Pt-10Cu)-20BN (mol %). Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Cu powder and the BN powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 90.2%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 480 particles, and increased significantly in comparison to the number of particles in Example 4.

Example 5

As the raw material powders, an Fe powder, a Pt powder, a C powder, a AgCu powder, and a $SiO_2$ powder were prepared, and these powders were weighed to achieve 77(35Fe-45Pt-10Ag-10Cu)-8$SiO_2$-15C (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the AgCu alloy powder, the $SiO_2$ powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 14.1%. Moreover, as a result of measuring the density of another end of the thus obtained sintered compact based on the Archimedes method, the density was 96.1%. Next, this sintered compact was sputtered under the same conditions as Example 1. When measuring the number of particles having a grain size of 0.25 μm or more that became adhered to the substrate by a particle counter, the result was 32 particles.

Comparative Example 7

As the raw material powders, an Fe powder, a Pt powder, a C powder, a Ag powder, and a $SiO_2$ powder were prepared, and these powders were weighed to achieve 77(35Fe-45Pt-20Ag)-8$SiO_2$-15C (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder, the $SiO_2$ powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 90.3%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 457 particles, and increased significantly in comparison to the number of particles in Example 5.

Example 6

As the raw material powders, an Fe powder, a Pt powder, a C powder, a AgCu powder, a $TiO_2$ powder, and a $Cr_2O_3$ powder were prepared, and these powders were weighed to achieve 73(53Fe-45Pt-1Ag-1Cu)-1$TiO_2$-1$Cr_2O_3$-25C (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the AgCu alloy powder, the $TiO_2$ powder, the $Cr_2O_3$ powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 0.8%. Moreover, as a result of measuring the density of another end of the thus obtained sintered compact based on the Archimedes method, the density was 95.3%. Next, this sintered compact was sputtered under the same conditions as Example 1. When measuring the number of particles having a grain size of 0.25 μm or more that became adhered to the substrate by a particle counter, the result was 40 particles.

Comparative Example 8

As the raw material powders, an Fe powder, a Pt powder, a C powder, a Ag powder, a $TiO_2$ powder, and a $Cr_2O_3$ powder were prepared, and these powders were weighed to achieve 73(53Fe-45Pt-2Ag)-1$TiO_2$-1$Cr_2O_3$-25C (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder, the $TiO_2$ powder, the $Cr_2O_3$ powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 89.4%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 509 particles, and increased significantly in comparison to the number of particles in Example 6.

Example 7

As the raw material powders, an FePt alloy powder, a BN powder, a Ag powder, a Cu powder, a MnO powder, and a $Ta_2O_5$ powder were prepared, and these powders were weighed to achieve 78.5(45Fe-45Pt-4Ag-6Cu)-0.5MnO-1$Ta_2O_5$-20BN (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder, the Cu powder, the MnO powder, the $Ta_2O_5$ powder and the BN powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 2.4%. Moreover, as a result of measuring the density of another end of the thus obtained sintered compact based on the Archimedes method, the density was 95.0%. Next, this sintered compact was sputtered under the same conditions as Example 1. When measuring the number of particles having a grain size of 0.25 μm or more that became adhered to the substrate by a particle counter, the result was 86 particles.

Comparative Example 9

As the raw material powders, an FePt alloy powder, a BN powder, a Cu powder, a MnO powder, and a $Ta_2O_5$ powder were prepared, and these powders were weighed to achieve 78.5(45Fe-45Pt-10Cu)-0.5MnO-1$Ta_2O_5$-20BN (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Cu powder, the MnO powder, the $Ta_2O_5$ powder and the BN powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 88.4%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 μm or more that became adhered to the substrate by a particle counter, the result was 623 particles, and increased significantly in comparison to the number of particles in Example 7.

Example 8

As the raw material powders, an FePt alloy powder, a C powder, a AgCu alloy powder, and a $SiO_2$ powder were prepared, and these powders were weighed to achieve 80(45Fe-45Pt-5Ag-5Cu)-15$SiO_2$-5C (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the AgCu alloy powder, the $SiO_2$ powder and the C powder using a V-shaped mixer, and further mixed using a sieve having a sieve mesh of 150 μm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 3.6%. Moreover, as a result of measuring the density of another end of the thus obtained sintered compact based on the Archimedes method, the density was 96.1%. Next, this sintered compact was sputtered under the same conditions as Example 1. When measuring the number of particles having a grain size of 0.25 µm or more that became adhered to the substrate by a particle counter, the result was 32 particles.

Comparative Example 10

As the raw material powders, an FePt alloy powder, a C powder, a Ag powder, and a $SiO_2$ powder were prepared, and these powders were weighed to achieve 80(45Fe-45Pt-10Ag)-15$SiO_2$-5C (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder, the $SiO_2$ powder and the C powder using a V-shaped mixer, and further mixed using a sieve having a sieve mesh of 150 µm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 90.3%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 µm or more that became adhered to the substrate by a particle counter, the result was 457 particles, and increased significantly in comparison to the number of particles in Example 8.

Example 9

As the raw material powders, an FePt alloy powder, a BN powder, a Ag powder, a Cu powder, and a $SiO_2$ powder were prepared, and these powders were weighed to achieve 85(45Fe-45Pt-4Ag-6Cu)-10$SiO_2$-5BN (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder, the Cu powder, the $SiO_2$ powder and the BN powder using a V-shaped mixer, and further mixed using a sieve having a sieve mesh of 150 µm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 2.4%. Moreover, as a result of measuring the density of another end of the thus obtained sintered compact based on the Archimedes method, the density was 95.9%. Next, this sintered compact was sputtered under the same conditions as Example 1. When measuring the number of particles having a grain size of 0.25 µm or more that became adhered to the substrate by a particle counter, the result was 56 particles.

Comparative Example 11

As the raw material powders, an FePt alloy powder, a BN powder, a Cu powder, and a $SiO_2$ powder were prepared, and these powders were weighed to achieve 85(45Fe-45Pt-10Cu)-10$SiO_2$-5BN (mol %).

Next, the FePt alloy powder was placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Cu powder, the $SiO_2$ powder and the BN powder using a V-shaped mixer, and further mixed using a sieve having a sieve mesh of 150 µm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 87.6%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 µm or more that became adhered to the substrate by a particle counter, the result was 1096 particles, and increased significantly in comparison to the number of particles in Example 9.

Example 10

As the raw material powders, an Fe powder, a Pt powder, a C powder, a BN powder, and a AgCu alloy powder were prepared, and these powders were weighed to achieve 60(50Fe-40Pt-5Ag-5Cu)-30C-10BN (mol %).

Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the AgCu alloy powder, the C powder and the BN powder using a V-shaped mixer, and further mixed using a sieve having a sieve mesh of 150 µm, and the mixed powder was filled in a carbon mold, and hot pressed under the same conditions as Example 1. Next, the sintered compact removed from the hot press mold was subject to hot isostatic pressing under the same conditions as Example 1.

As a result of cutting out one end (corresponds to the cross section that is perpendicular to the sputtered surface) of the thus obtained sintered compact, performing mirror polishing thereto and then observing the polished surface with a laser microscope, the area ratio of the AgCu alloy grains was 2.9%. Moreover, as a result of measuring the density of another end of the thus obtained sintered compact based on the Archimedes method, the density was 95.2%. Next, this sintered compact was sputtered under the same conditions as Example 1. When measuring the number of particles having a grain size of 0.25 µm or more that became adhered to the substrate by a particle counter, the result was 91 particles.

Comparative Example 12

As the raw material powders, an Fe powder, a Pt powder, a C powder, a BN powder, and a Ag powder were prepared, and these powders were weighed to achieve 60(50Fe-40Pt-10Ag)-30C-10BN (mol %). Next, the Fe powder and the Pt powder were placed in a medium agitation mill having a capacity of 5 liters together with zirconium balls as the pulverizing medium, and pulverized for 2 hours at a rotation speed of 300 rpm. Subsequently, the powder removed from the medium agitation mill was mixed with the Ag powder, the C powder and the BN powder using a V-shaped mixer, and further mixed using a sieve having a sieve mesh of 150 µm, and the mixed powder was filled in a carbon mold, and hot pressed under the same conditions as Example 1. Next, the sintered compact removed from the hot press mold was subject to hot isostatic pressing under the same conditions as Example 1.

As a result of measuring the density of one end of the thus obtained sintered compact based on the Archimedes method, the density was 88.4%. Subsequently, the sintered compact was machined with a lathe into a shape having a diameter of 180.0 mm and a thickness of 5.0 mm, and thereafter mounted in magnetron sputtering equipment (C-3010 sputtering system manufactured by Canon Anelva) to perform sputtering. The sputtering conditions were the same as those of Example 1. When measuring the number of particles having a grain size of 0.25 µm or more that became adhered to the substrate by a particle counter, the result was 838 particles, and increased significantly in comparison to the number of particles in Example 10.

INDUSTRIAL APPLICABILITY

The FePt-based sintered sputtering target containing C and/or BN of the present invention yields a superior effect of being able to reduce the number of particles generated during sputtering. Accordingly, the present invention is effective as a ferromagnetic sputtering target for depositing a magnetic thin film of a magnetic recording medium, particularly a granular-type magnetic recording layer.

The invention claimed is:

1. An FePt-based sintered sputtering target having a sintered structure comprising a phase of FePt-based ferromagnetic alloy containing therein a dispersion of AgCu alloy grains as a sintering agent and non-magnetic particles of C and/or BN, wherein the AgCu alloy grains as a whole have an area ratio of 0.5% or more and 15% or less in a microstructure of a polished cross section made perpendicular to a sputtering face of the sputtering target.

2. The sputtering target according to claim 1, wherein a total content of Ag and Cu constituting the AgCu alloy in a composition of the sputtering target is 1 to 20 mol %.

3. The sputtering target according to claim 2, wherein a ratio of Cu content relative to the total content of Ag and Cu is 10 to 85 mol %.

4. The sputtering target according to claim 3, wherein a Pt content in the composition of the sputtering target is 30 to 70 mol %.

5. The sputtering target according to claim 4, wherein a C content in the composition of the sputtering target is 5 to 60 mol %.

6. The sputtering target according to claim 5, wherein a BN content in the composition of the sputtering target is 2 to 40 mol %.

7. The sputtering target according to claim 6, wherein one or more types of oxides of metals selected from the group consisting of Y, Ti, Zr, Hf, V, Nb, Ta, Cr, Mo, W, Mn, Fe, Co, Ni, Al, Ga, and Si are contained in the sputtering target in a total amount of 0.1 to 20 mol % relative to the composition of the sputtering target.

8. The sputtering target according to claim 7, wherein the sputtering target has a relative density of 95% or higher.

9. The sputtering target according to claim 1, wherein a Pt content in a composition of the sputtering target is 30 to 70 mol %.

10. The sputtering target according to claim 1, wherein a C content in a composition of the sputtering target is 5 to 60 mol %.

11. The sputtering target according to claim 1, wherein a BN content in a composition of the sputtering target is 2 to 40 mol %.

12. The sputtering target according to claim 1, wherein one or more types of oxides of metals selected from the group consisting of Y, Ti, Zr, Hf, V, Nb, Ta, Cr, Mo, W, Mn, Fe, Co, Ni, Al, Ga, and Si are contained in the sputtering target in a total amount of 0.1 to 20 mol % relative to a composition of the sputtering target.

13. The sputtering target according to claim 1, wherein the sputtering target has a relative density of 95% or higher.

* * * * *